United States Patent
Song

(10) Patent No.: US 8,829,554 B2
(45) Date of Patent: Sep. 9, 2014

(54) LIGHT EMITTING ELEMENT AND A PRODUCTION METHOD THEREFOR

(75) Inventor: June O Song, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 552 days.

(21) Appl. No.: 12/936,090

(22) PCT Filed: Apr. 2, 2009

(86) PCT No.: PCT/KR2009/001710
§ 371 (c)(1),
(2), (4) Date: Feb. 22, 2011

(87) PCT Pub. No.: WO2009/145483
PCT Pub. Date: Dec. 3, 2009

(65) Prior Publication Data
US 2011/0140076 A1      Jun. 16, 2011

(30) Foreign Application Priority Data

Apr. 2, 2008 (KR) .................. 10-2008-0030919
Apr. 4, 2008 (KR) .................. 10-2008-0031900

(51) Int. Cl.
*H01L 33/00* (2010.01)
*H01L 33/40* (2010.01)
*H01L 33/44* (2010.01)

(52) U.S. Cl.
CPC ............ *H01L 33/0079* (2013.01); *H01L 33/44* (2013.01); *H01L 33/405* (2013.01)
USPC 257/99; 257/98; 257/E33.063; 257/E33.068; 257/E33.059

(58) Field of Classification Search
USPC ....................................... 257/98, 99
See application file for complete search history.

(56) References Cited

U.S. PATENT DOCUMENTS

| | | | | |
|---|---|---|---|---|
| 6,150,672 | A * | 11/2000 | Kaneko | 257/94 |
| 6,841,802 | B2 * | 1/2005 | Yoo | 257/98 |
| 7,259,402 | B2 * | 8/2007 | Edmond et al. | 257/99 |
| 7,384,807 | B2 | 6/2008 | Yoo | 438/29 |
| 7,659,553 | B2 * | 2/2010 | Kato et al. | 257/98 |
| 7,723,743 | B2 * | 5/2010 | Yahata et al. | 257/98 |
| 7,772,020 | B2 | 8/2010 | Yoo | 438/29 |

(Continued)

FOREIGN PATENT DOCUMENTS

| | | |
|---|---|---|
| JP | 2002-076523 A | 3/2002 |
| JP | 2004-281863 | 10/2004 |

(Continued)

OTHER PUBLICATIONS

International Search Report issued In PCT/KR2009/001710 dated Dec. 3, 2009.

(Continued)

*Primary Examiner* — Jerome Jackson, Jr.
(74) *Attorney, Agent, or Firm* — Ked & Associates LLP

(57) ABSTRACT

A light emitting device according to the embodiment includes a support substrate; a reflective layer over the support substrate; an ohmic contact layer over the reflective layer; a light emitting semiconductor layer including a second conductive semiconductor layer, an active layer and a first conductive semiconductor layer over the ohmic contact layer; a first passivation layer surrounding a lateral side of the light emitting semiconductor layer; and a second passivation layer surrounding lateral sides of the first passivation layer and the reflective layer.

19 Claims, 20 Drawing Sheets

(56) References Cited

U.S. PATENT DOCUMENTS

| | | |
|---|---|---|
| 2003/0122141 A1 | 7/2003 | Wong et al. ............ 257/88 |
| 2006/0065901 A1 | 3/2006 | Aoyagi et al. ............ 257/79 |
| 2007/0181891 A1 | 8/2007 | Eisert et al. ............ 257/82 |

FOREIGN PATENT DOCUMENTS

| | | |
|---|---|---|
| JP | 2005-522875 A | 7/2005 |
| JP | 2006-100500 A | 4/2006 |
| JP | 2006-516066 A | 6/2006 |
| JP | 2007-511065 | 4/2007 |
| JP | 2007-526618 A | 9/2007 |
| JP | 2007-335793 A | 12/2007 |
| KR | 10-2007-0038272 | 4/2007 |

OTHER PUBLICATIONS

Japanese Office Action dated Jul. 18, 2012 issued in Application No. 2011-502858.

* cited by examiner

LIGHT EMITTING ELEMENT AND A PRODUCTION METHOD THEREFOR

TECHNICAL FIELD

The disclosure relates to a light emitting device and a manufacturing method thereof.

BACKGROUND ART

Recently, a light emitting diode (LED) is spotlighted as a light emitting device. Since the LED can convert electric energy into light energy with high efficiency and long life span of about 5 years or more, the LED can remarkably reduce the energy consumption and repair and maintenance cost. In this regard, the LED is spotlighted in the next-generation lighting field.

Such an LED includes a first conductive semiconductor layer, an active layer and a second conductive semiconductor layer, in which the active layer generates light according to current applied thereto through the first and second conductive semiconductor layers.

The LED may be classified into a lateral type LED and a vertical type LED.

According to the lateral type LED, a first conductive semiconductor layer, an active layer and a second conductive semiconductor layer are formed on a growth substrate, and the second conductive semiconductor layer, the active layer and the first conductive semiconductor layer are partially removed such that a part of the first conductive semiconductor layer can be exposed to form an electrode layer. Thus, the light emitting area may be reduced so that the light efficiency may be degraded.

In addition, according to the lateral type LED, since the first conductive semiconductor layer, the active layer and the second conductive semiconductor layer are formed on the growth substrate having low thermal conductivity, the heat dissipation is not easy.

In contrast, according to the vertical type LED, a first electrode layer is formed on the first conductive semiconductor layer and a second electrode layer is formed under the second conductive semiconductor layer, so it is not necessary to remove the active layer to form the electrode layer. Thus, the light emitting area may not be reduced, so that the light efficiency may be improved as compared with that of the lateral type LED.

In addition, according to the vertical type LED, heat is transferred through the second electrode layer, so the heat dissipation is easy.

Meanwhile, the vertical type LED may employ the electroplating scheme and the wafer bonding scheme when the second electrode serving as a support substrate is formed under the second conductive semiconductor layer.

If the support substrate is manufactured through the electroplating scheme, the manufacturing process may be facilitated, but the reliability of the LED may be degraded. In addition, if the support substrate is manufactured through the wafer bonding scheme, the manufacturing process may be complicated, but the reliability of the LED may be improved.

In particular, if the support substrate is manufactured through the wafer bonding scheme, since the growth substrate and the support substrate are made from heterogeneous materials, the crack or debonding may occur in the LED after the wafer has been bonded due to thermal stress caused by difference in thermal expansion coefficient.

DISCLOSURE

Technical Problem

The embodiment provides a light emitting device having a novel structure and a manufacturing method thereof.

The embodiment provides a method of manufacturing a light emitting device through a novel wafer bonding scheme.

Technical Solution

A light emitting device according to the embodiment may include a support substrate; a reflective layer over the support substrate; an ohmic contact layer over the reflective layer; a light emitting semiconductor layer including a second conductive semiconductor layer, an active layer and a first conductive semiconductor layer over the ohmic contact layer; a first passivation layer surrounding a lateral side of the light emitting semiconductor layer; and a second passivation layer surrounding lateral sides of the first passivation layer and the reflective layer.

A method of manufacturing a light emitting device according to the embodiment may include the steps of preparing a first structure including a light emitting semiconductor layer over a growth substrate, an ohmic contact layer over the light emitting semiconductor layer, a reflective layer over the ohmic contact layer, and a passivation layer surrounding the light emitting semiconductor layer; preparing a second structure by using a support substrate; preparing a third structure by using a temporary substrate; forming a complex structure by bonding the first to third structures through a wafer bonding layer while interposing the second structure between the first and third structures; separating the growth substrate from the complex structure; forming a first electrode layer on the light emitting semiconductor layer; and removing the temporary substrate.

A method of manufacturing a light emitting device according to the embodiment may include the steps of preparing a first structure including a light emitting semiconductor layer over a growth substrate; preparing a second structure by using a first support substrate; preparing a third structure by using a first temporary substrate; forming a first complex structure by bonding the first to third structures through a wafer bonding layer while interposing the second structure between the first and third structures; forming a second complex structure by separating the first temporary substrate from the first complex structure; preparing a fourth structure by using a second support substrate; preparing a fifth structure by using a second temporary substrate; forming a third complex structure by bonding the second complex structure, the fourth structure and the fifth structure through a wafer bonding layer while interposing the fourth structure between the second complex structure and the fifth structure; and removing the second temporary substrate from the third complex structure.

Advantageous Effects

The embodiment can provide a light emitting device having a novel structure and a manufacturing method thereof.

The embodiment can provide a method of manufacturing a light emitting device through a novel wafer bonding scheme.

BEST MODE

Mode for Invention

Figure 1:
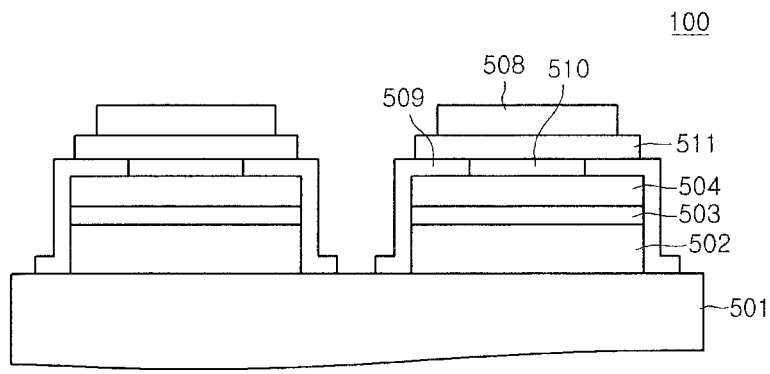
FIGS. 1 to 10 are views showing the procedure for manufacturing a light emitting device according to the first embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

FIGS. 1 to 10 are views showing the procedure for manufacturing a light emitting device according to the first embodiment.

Referring to FIG. 1, a light emitting semiconductor layer including a first conductive semiconductor layer 502, an active layer 503 and a second conductive semiconductor layer 504 is formed on a growth substrate 501.

In addition, the light emitting semiconductor layer is mesa-etched to form a plurality of unit devices, and a first passivation layer 509 is formed such that the light emitting semiconductor layer is surrounded by the first passivation layer 509. Then, the first passivation layer 509 is removed in such a manner that the second conductive semiconductor layer 504 can be partially exposed and an ohmic contact layer 510 is formed on the second conductive semiconductor layer 504.

After that, a reflective layer 511 is formed on the first passivation layer 509 and the ohmic contact layer 510 and a first wafer bonding layer 508 is formed on the reflective layer 511, thereby forming a first structure 100.

For instance, the growth substrate 501 may include one selected from the group consisting of $Al_2O_3$, SiC, Si, AlN, GaN, AlGaN, glass, and GaAs.

Although not shown in the drawings, a buffer layer including at least one of InGaN, AlN, SiC, SiCN, and GaN can be formed the growth substrate 501 before the first conductive semiconductor layer 502 is grown on the growth substrate 501.

The light emitting semiconductor layer including the first conductive semiconductor layer 502, the active layer 503 and the second conductive semiconductor layer 504 can be formed by using group-III nitride-based semiconductor elements. For instance, the first conductive semiconductor layer 502 may include a GaN layer including n type impurities such as Si, and the second conductive semiconductor layer 504 may include a GaN layer including p type impurities such as Mg. In addition, electrons are recombined with holes at the active layer 503 so that the active layer 503 generates light. The active layer 503 may include one of InGaN, AlGaN, GaN, and AlInGaN. The wavelength of the light emitted from the light emitting device may vary depending on materials used for the active layer 503.

Although not shown in the drawings, an interface modification layer can be formed on the second conductive semiconductor layer 504.

The interface modification layer may include the superlattice structure, one of InGaN, GaN, AlInN, AlN, InN and AlGaN doped with first conductive impurities, one of InGaN, GaN, AlInN, AlN, InN and AlGaN doped with second conductive impurities, or one of group-III nitride-based elements having nitrogen-polar surfaces. In particular, the interface modification layer having the superlattice structure may be formed by using nitride or carbon nitride including group-II, group-III, or group-IV elements.

The first passivation layer 509 is formed at an upper peripheral portion of the light emitting semiconductor layer while surrounding the lateral sides of the light emitting semiconductor layer. For instance, the first passivation layer 509 may include an electric insulating material, such as $SiO_2$, $Al_2O_3$, or $SiN_x$. The first passivation layer 509 may have a thickness of about 10 nm to 100 nm.

An ohmic contact interface is formed between the ohmic contact layer 510 and the second conductive semiconductor layer 504. For instance, the ohmic contact layer 510 may include at least one of ITO, ZnO, IZO, and NiO—Au.

A current blocking area can be formed on the ohmic contact layer 510 in order to spread current by preventing the current applied to the light emitting semiconductor layer from being concentrated onto a local area. For instance, the current blocking area may include an electric insulating material, an empty space filled with air or a material forming a schottky contact interface with respect to the second conductive semiconductor layer 504.

The reflective layer 511 is formed on the ohmic contact layer 510 and the first passivation layer 509 and has an area larger than that of the ohmic contact layer 510.

For instance, the reflective layer 511 may include one selected from the group consisting of Ag, an Ag alloy, a solid solution including Ag, Rh, a Rh alloy, a solid solution including Rh, Al, an Al alloy, a solid solution including Al, Pt, a Pt alloy, a solid solution including Pt, Pd, a Pd alloy, a solid solution including Pd, a Pt alloy, a solid solution including Pt, Au, an Au alloy, a solid solution including Au, Ni, a Ni alloy, a solid solution including Ni, and silicide such as Ag—Si, Rh—Si, Pd—Si, Ni—Si, Cr—Si or Pt—Si.

The first wafer bonding layer 508 is formed on the reflective layer 511 and includes a material having electric conductivity such that the first wafer bonding layer 508 may represent strong bonding strength under the predetermined pressure and the temperature of 300° C. to 600° C.

For instance, the first wafer bonding layer 508 may include at least one selected from the group consisting of Au, Ag, Al, Si, Ge, W, Mo, V, Sc, Hf, Ir, Re, Co, Zr, Ru, Ta, Nb, Mn, Rh, Cu, Ni, Ti, Pd, Pt, Cr, and rare-earth metal.

Figure 2:
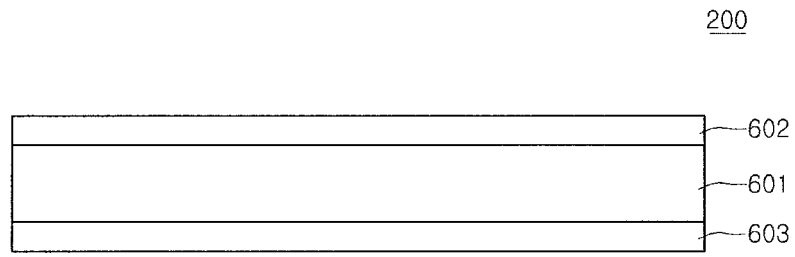

Referring to FIG. 2, a second structure 200 is prepared. The second structure 200 includes a support substrate 601 formed at top and bottom surfaces thereof with second and third wafer bonding layers 602 and 603, respectively.

The support substrate 601 is an electric conductive layer. The support substrate 601 may be a wafer substrate including at least one of Si, SiGe, ZnO, GaN, AlSiC and GaAs, or may be a metal, an alloy or a solid solution including at least one of Cu, Ni, Ag, Al, Nb, Ta, Ti, Au, Pd, and W.

The support substrate 601 can be prepared in the form of a sheet, a disk, or a foil having a thickness of about 5 μm to 1 mm. The support substrate 601 can be formed through the electro-plating, physical vapor deposition (PVD), or chemical vapor deposition (CVD).

Similar to the first wafer bonding layer 508, the second and third wafer bonding layers 602 and 603 may include at least one selected from the group consisting of Au, Ag, Al, Si, Ge, W, Mo, V, Sc, Hf, Ir, Re, Co, Zr, Ru, Ta, Nb, Mn, Rh, Cu, Ni, Ti, Pd, Pt, Cr, and rare-earth metal.

Figure 3:

Referring to FIG. 3, a third structure 300 is prepared. The third structure 300 includes a sacrificial separation layer 702 and a fourth wafer bonding layer 703 formed on a temporary substrate 701.

The temporary substrate 701 may include a material representing difference in thermal expansion coefficient within 2 ppm/° C. with respect to that of the growth substrate 501. The temporary substrate 701 can be formed by using a material the same as that of the growth substrate 501. For instance, the temporary substrate 701 may include one of $Al_2O_3$, SiC, Si, and GaAs.

The sacrificial separation layer 702 may include one of group II-VI compounds including ZnO, which is subject to the thermal-chemical decomposition reaction as laser beam is irradiated thereto; group III-V compounds including GaN; ITO; PZT; and SU-8. In addition, the sacrificial separation layer 702 may include one of Al, Au, Ag, Cr, Ti, $SiO_2$, and $SiN_x$, which are rapidly dissolved in a wet solution.

Similar to the first wafer bonding layer 508, the fourth wafer bonding layer 703 may include at least one selected from the group consisting of Au, Ag, Al, Si, Ge, W, Mo, V, Sc, Hf, Ir, Re, Co, Zr, Ru, Ta, Nb, Mn, Rh, Cu, Ni, Ti, Pd, Pt, Cr, and rare-earth metal.

Figure 4:
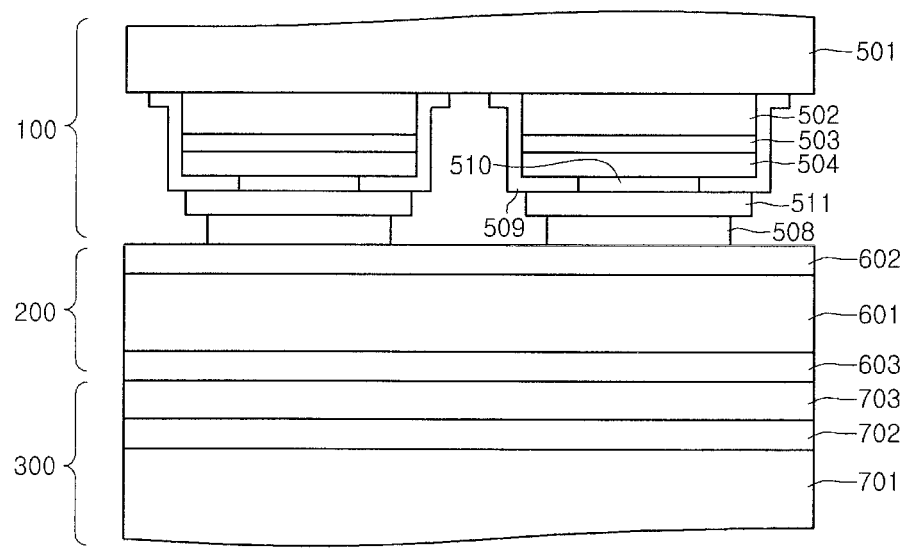

Referring to FIG. 4, a complex structure is formed by bonding the first structure 100 shown in FIG. 1, the second structure 200 shown in FIG. 2 and the third structure 300 shown in FIG. 3.

The first wafer bonding layer 508 is bonded to the second wafer bonding layer 602, and the third wafer bonding layer 603 is bonded to the fourth wafer bonding layer 703.

The first to third structures 100, 200 and 300 can be bonded under the predetermined pressure and the temperature of about 300° C. to 600° C. at the atmosphere of vacuum, nitrogen ($N_2$), or argon (Ar).

The third structure 300 is disposed in opposition to the first structure 100 about the second structure 200. Since the thermal expansion coefficient of the first structure 100 is similar to that of the third structure 300, the crack or debonding caused by the difference in the thermal expansion coefficient can be prevented when the first structure 100 is bonded with the second structure 200.

Therefore, the first and second structures 100 and 200 can be bonded at the temperature of 300° C. or above where the difference in the thermal expansion coefficient may exert great influence upon the first and second structures 100 and 200.

Figure 5:
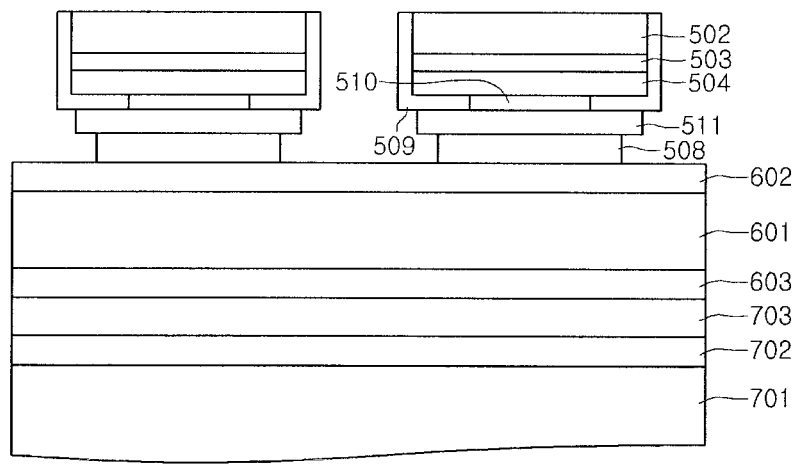

Referring to FIG. 5, the growth substrate 501 is separated from the complex structure shown in FIG. 4.

The growth substrate 501 can be separated through the laser lift-off scheme by using eximer laser, or the growth substrate 501 can be separated through the dry or wet etching scheme.

In detail, if the eximer laser beam having a predetermined wavelength is irradiated onto the growth substrate 501, thermal energy is concentrated onto the boundary surface between the growth substrate 501 and the first conductive semiconductor layer 502, so that the interface of the first conductive semiconductor layer 502 is thermo-chemically decomposed into Ga and N molecules, thereby separating the growth substrate 501.

Figure 6:
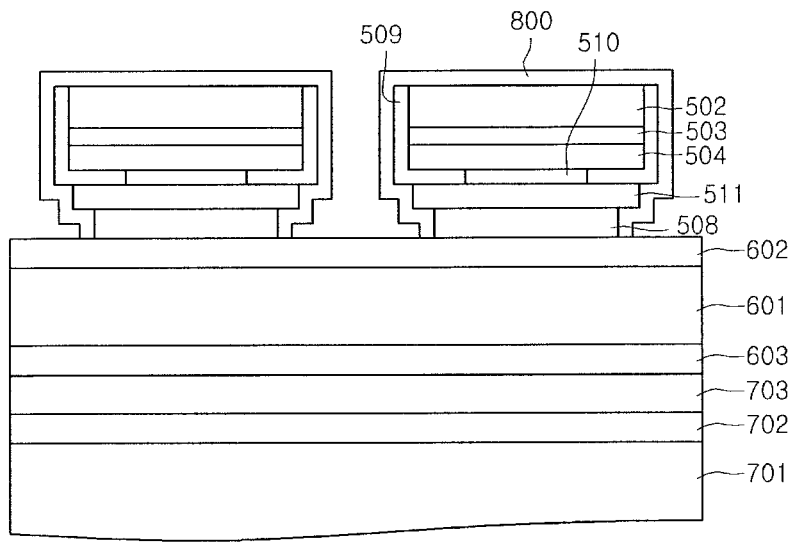

Referring to FIG. 6, a second passivation layer 800 is formed on top surfaces of the first conductive semiconductor layer 502 and the first passivation layer 509, and lateral sides of the first passivation layer 509, the reflective layer 511 and the first wafer bonding layer 508.

For instance, the second passivation layer 800 may include an electric insulating material, such as $SiO_2$, $Al_2O_3$, or $SiN_x$. The second passivation layer 800 may have a thickness of about 100 nm to 1000 nm.

The second passivation layer 800 may be thicker than the first passivation layer 509 and can be formed by using a material different from the material for the first passivation layer 509.

The first and second passivation layers 509 and 800 protect the light emitting semiconductor layer from external conductive materials or moisture.

Figure 7:
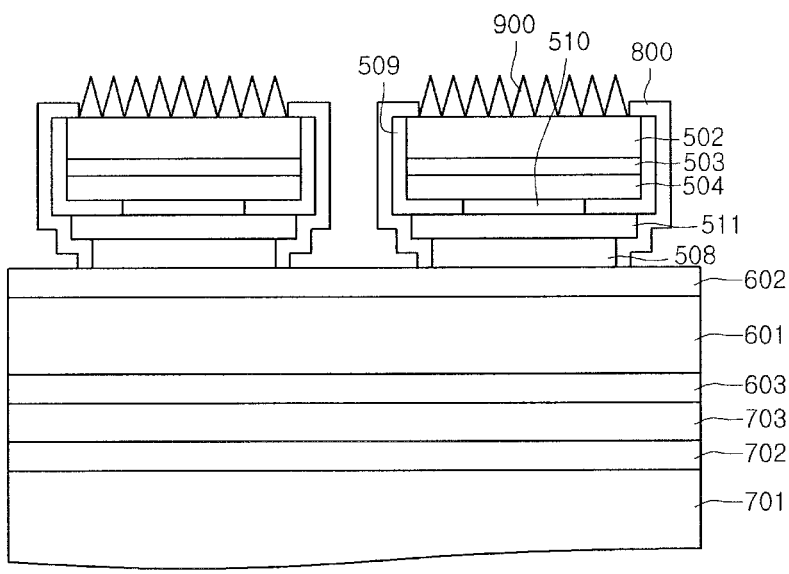

Referring to FIG. 7, the second passivation layer 800 formed on the first conductive semiconductor layer 502 is partially removed to form a light extracting structure 900 on the first conductive semiconductor layer 502.

The light extracting structure 900 can be prepared in the form of an irregular concave-convex pattern through the wet etching process, or in the form of a regular concave-convex pattern through the lithography process.

Figure 8:
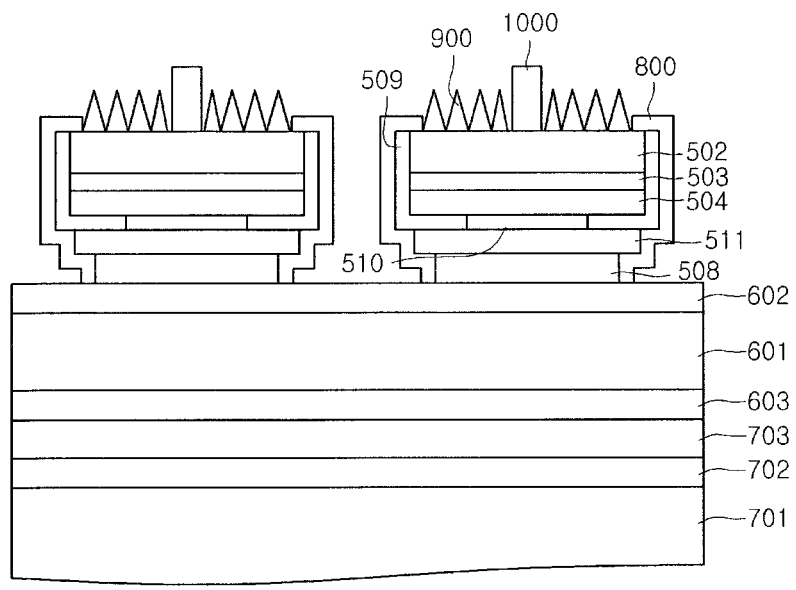

Referring to FIG. 8, a first electrode layer 1000 is formed on the first conductive semiconductor layer 502.

An ohmic contact interface is formed between the first electrode layer 1000 and the first conductive semiconductor layer 502.

Figure 9:
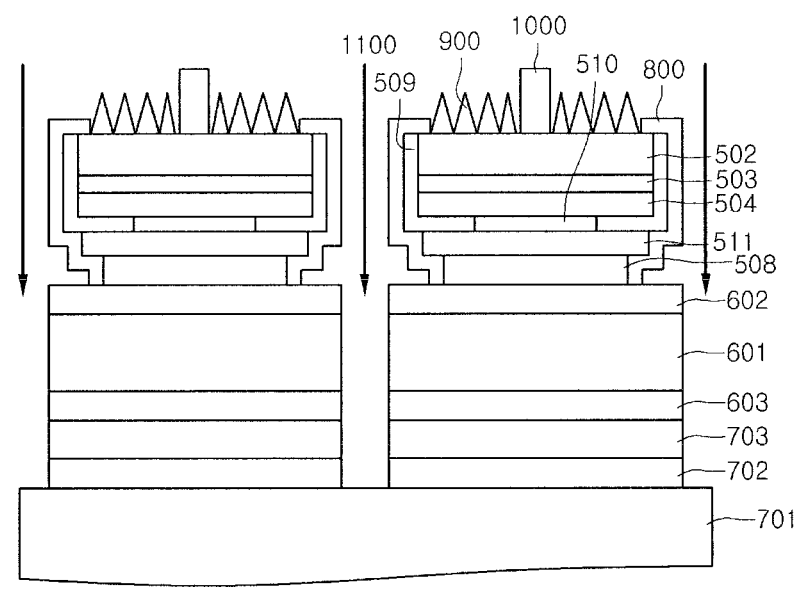

Referring to FIG. 9, an isolation etching 1100 is performed to expose the temporary substrate 701 such that a plurality of light emitting structures can be formed on the temporary substrate 701.

Figure 10:
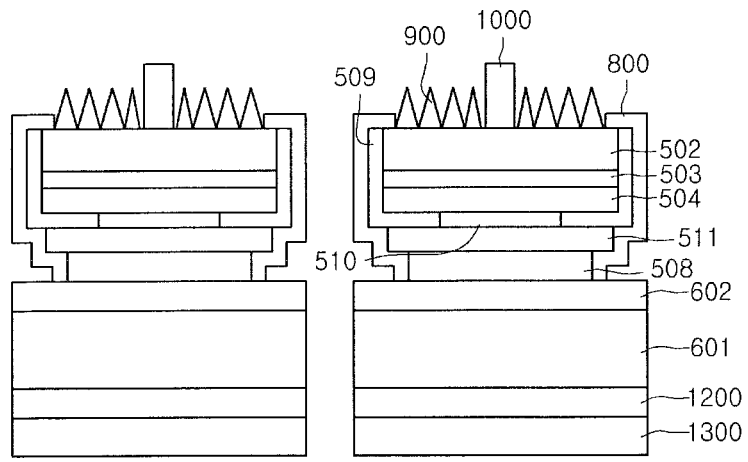

Referring to FIG. 10, the temporary substrate 701 is removed through the laser lift-off scheme, the drying etching scheme, the wet etching scheme, the CMP scheme, or the polishing scheme.

When the temporary substrate 701 is removed through the laser lift-off scheme, the sacrificial separation layer 702 is thermo-chemically decomposed, so that the temporary substrate 701 can be separated.

Then, the third and fourth wafer bonding layers 603 and 703 are removed and a die bonding layer 1300 is formed under the support substrate 601. The die bonding layer 1300 is securely boned to a circuit board, on which the light emitting device is mounted, or a die at low resistance.

In this manner, the light emitting device according to the first embodiment can be manufactured.

FIGS. 11 to 19 are views showing the procedure for manufacturing a light emitting device according to the second embodiment.

The manufacturing method for the light emitting device according to the second embodiment is similar to that of the first embodiment, so the description about processes described in the first embodiment will be omitted in order to avoid redundancy.

Figure 11:
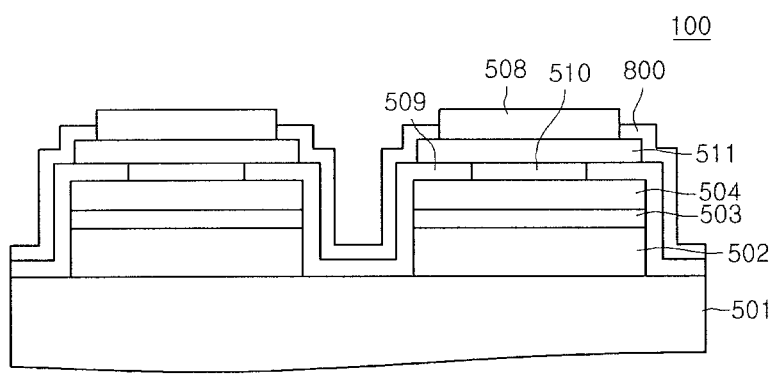
FIGS. 11 to 19 are views showing the procedure for manufacturing a light emitting device according to the second embodiment.

Referring to FIG. 11, a light emitting semiconductor layer including a first conductive semiconductor layer 502, an active layer 503 and a second conductive semiconductor layer 504 is formed on a growth substrate 501. In addition, the light emitting semiconductor layer is mesa-etched to form a plurality of unit devices, and a first passivation layer 509 and an ohmic contact layer 510 are formed such that the light emitting semiconductor layer is surrounded by the first passivation layer 509 and the ohmic contact layer 510. Then, a reflective layer 511 is formed on the first passivation layer 509 and the ohmic contact layer 510 and a second passivation layer 800 is formed on the reflective layer 511 and the first passivation layer 509. After that, the second passivation layer 800 is partially removed in order to form a first wafer bonding layer 508 on the exposed reflective layer 511, thereby forming a first structure 100.

According to the second embodiment, different from the first embodiment, the second passivation layer 800 is formed when the first structure 100 is manufactured. The second passivation layer 800 surrounds the lateral side and the top surface of the reflective layer 511 and partially makes contact with the lateral side of the first wafer bonding layer 508.

Figure 12:
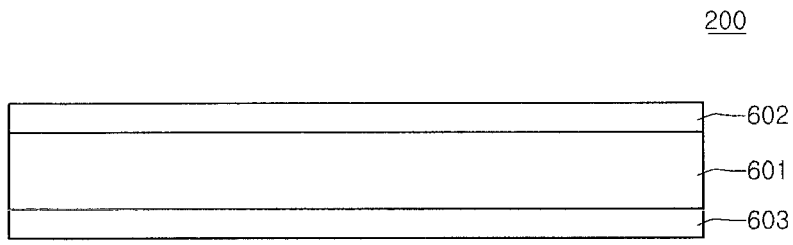

Referring to FIG. 12, a second structure 200 is prepared. The second structure 200 includes a support substrate 601 formed at top and bottom surfaces thereof with second and third wafer bonding layers 602 and 603, respectively.

Figure 13:
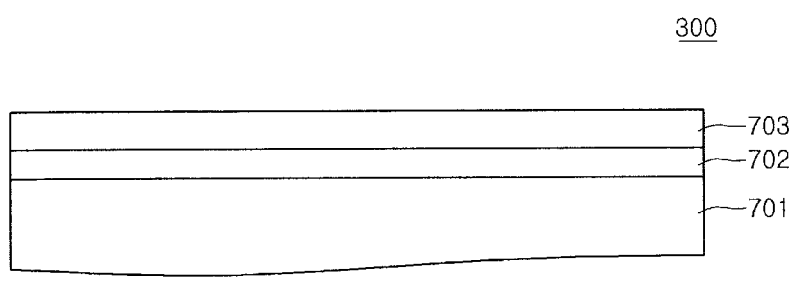

Referring to FIG. 13, a third structure 300 is prepared. The third structure 300 includes a sacrificial separation layer 702 and a fourth wafer bonding layer 703 formed on a temporary substrate 701.

Figure 14:
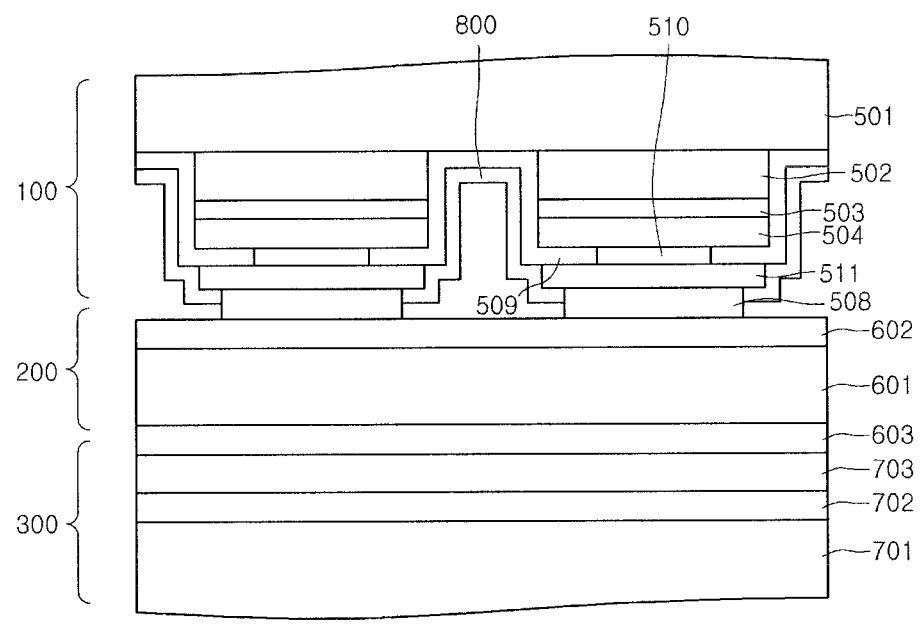

Referring to FIG. 14, a complex structure is formed by bonding the first structure 100 shown in FIG. 11, the second structure 200 shown in FIG. 12 and the third structure 300 shown in FIG. 13.

The first wafer bonding layer 508 is bonded to the second wafer bonding layer 602, and the third wafer bonding layer 603 is bonded to the fourth wafer bonding layer 703.

Figure 15:
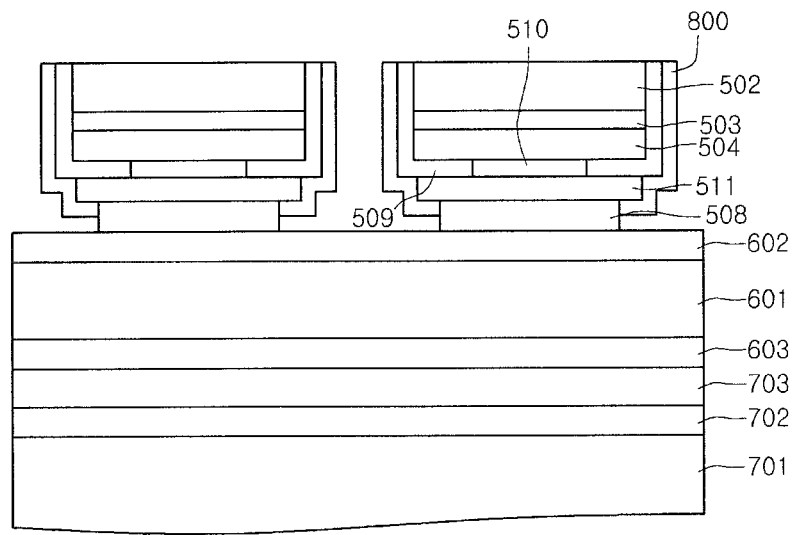

Referring to FIG. 15, the growth substrate 501 is separated from the complex structure shown in FIG. 14.

Figure 16:
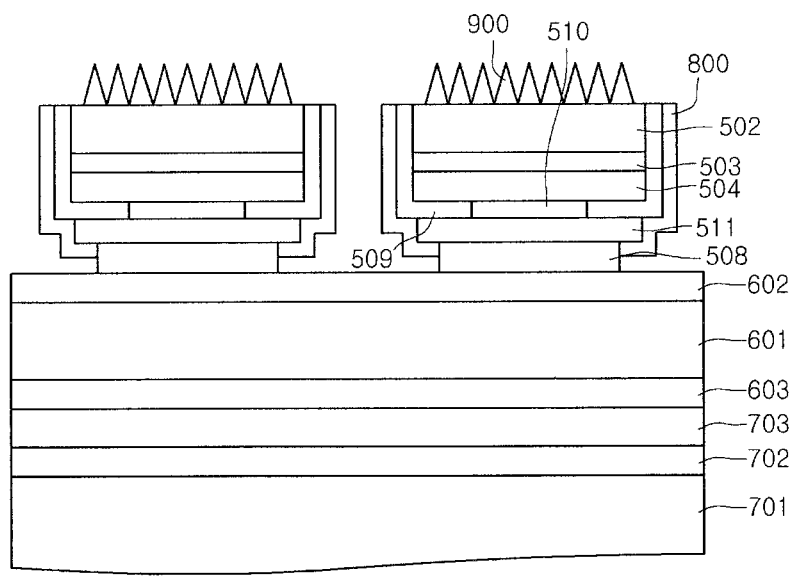

Referring to FIG. 16, a light extracting structure 900 is formed on the first conductive semiconductor layer 502.

Figure 17:
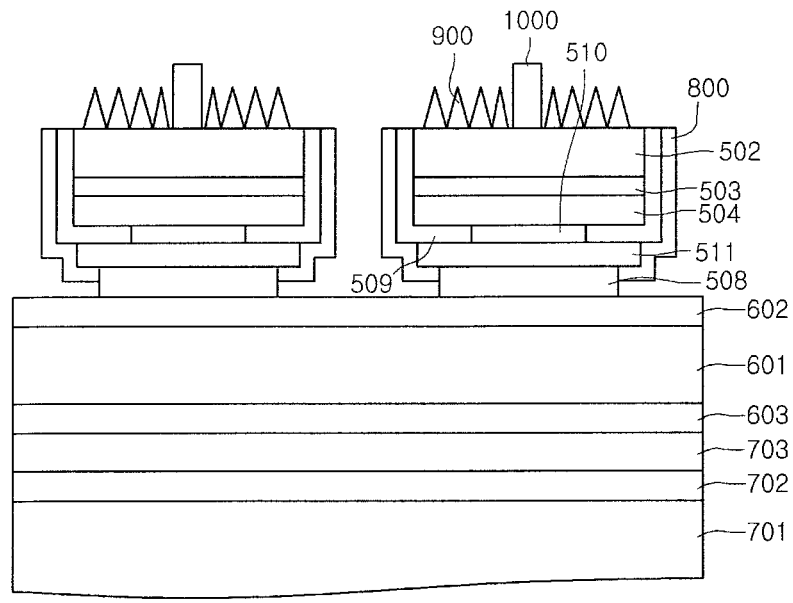

Referring to FIG. 17, a first electrode layer 1000 is formed on the first conductive semiconductor layer 502.

Figure 18:
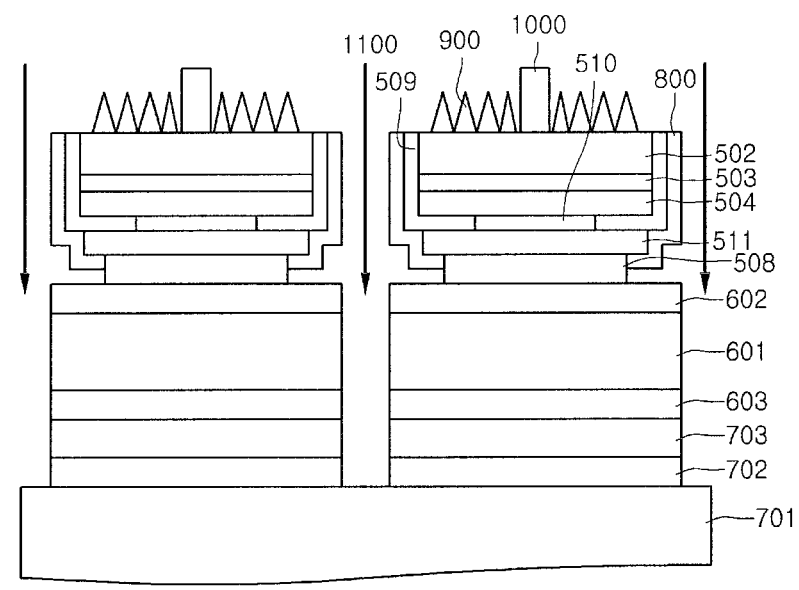

Referring to FIG. 18, an isolation etching 1100 is performed to expose the temporary substrate 701 such that a plurality of light emitting structures can be formed on the temporary substrate 701.

Figure 19:
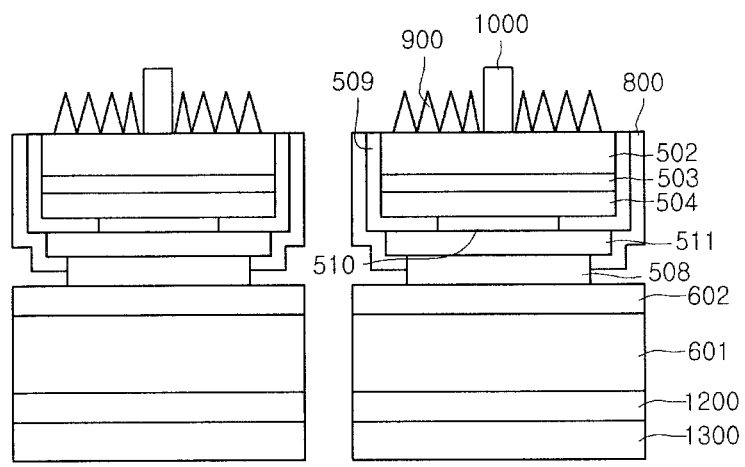

Referring to FIG. 19, the temporary substrate 701 is removed through the laser lift-off scheme, the drying etching scheme, the wet etching scheme, the CMP scheme, or the polishing scheme. When the temporary substrate 701 is removed through the laser lift-off scheme, the sacrificial separation layer 702 is thermo-chemically decomposed, so that the temporary substrate 701 can be separated.

Then, the third and fourth wafer bonding layers 603 and 703 are removed and a die bonding layer 1300 is formed under the support substrate 601. The die bonding layer 1300 is securely boned to a circuit board, on which the light emitting device is mounted, or a die at low resistance.

In this manner, the light emitting device according to the second embodiment can be manufactured.

FIGS. 20 to 33 are views showing the procedure for manufacturing a light emitting device according to the third embodiment.

The manufacturing method for the light emitting device according to the third embodiment is similar to that of the first embodiment, so the description about processes described in the first embodiment will be omitted in order to avoid redundancy.

Figure 20:
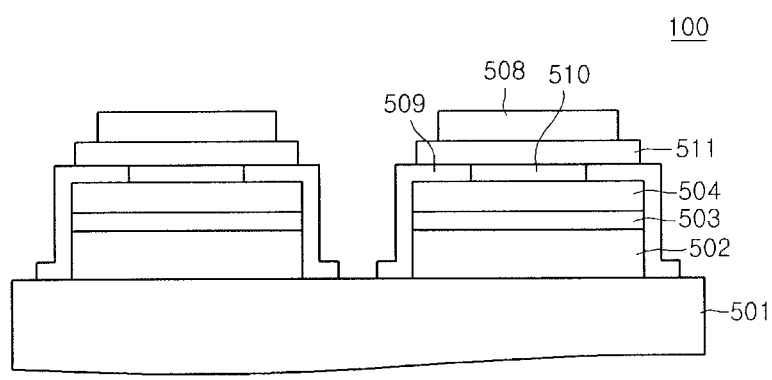
FIGS. 20 to 33 are views showing the procedure for manufacturing a light emitting device according to the third embodiment.

Referring to FIG. 20, a light emitting semiconductor layer including a first conductive semiconductor layer 502, an active layer 503 and a second conductive semiconductor layer 504 is formed on a growth substrate 501. In addition, the light emitting semiconductor layer is mesa-etched to form a plurality of unit devices, and a first passivation layer 509 is formed such that the light emitting semiconductor layer is surrounded by the first passivation layer 509. Then, the first passivation layer 509 is removed such that the second conductive semiconductor layer 504 can be partially exposed. After that, an ohmic contact layer 510 is formed on the second conductive semiconductor layer 504. Then, a reflective layer 511 is formed on the first passivation layer 509 and the ohmic contact layer 510 and a first wafer bonding layer 508 is formed on the reflective layer 511, thereby forming a first structure 100.

Figure 21:
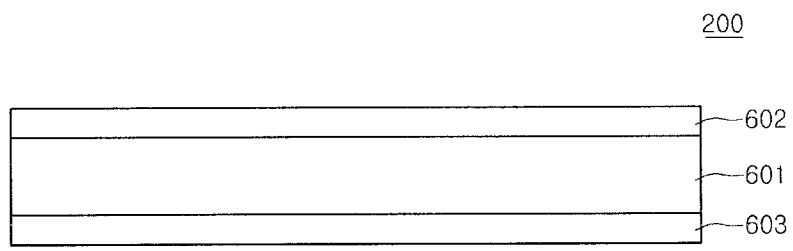

Referring to FIG. 21, a second structure 200 is prepared. The second structure 200 includes a first support substrate 601 formed at top and bottom surfaces thereof with second and third wafer bonding layers 602 and 603, respectively.

Figure 22:
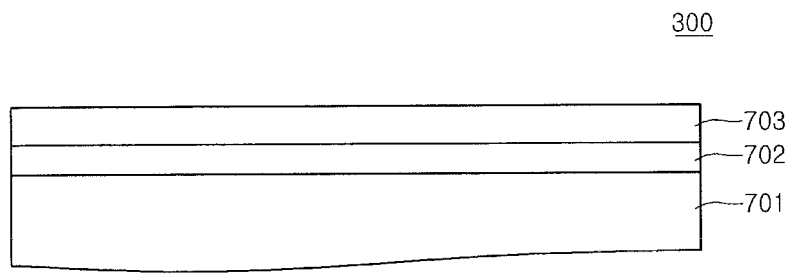

Referring to FIG. 22, a third structure 300 is prepared. The third structure 300 includes a first sacrificial separation layer 702 and a fourth wafer bonding layer 703 formed on a first temporary substrate 701.

Figure 23:
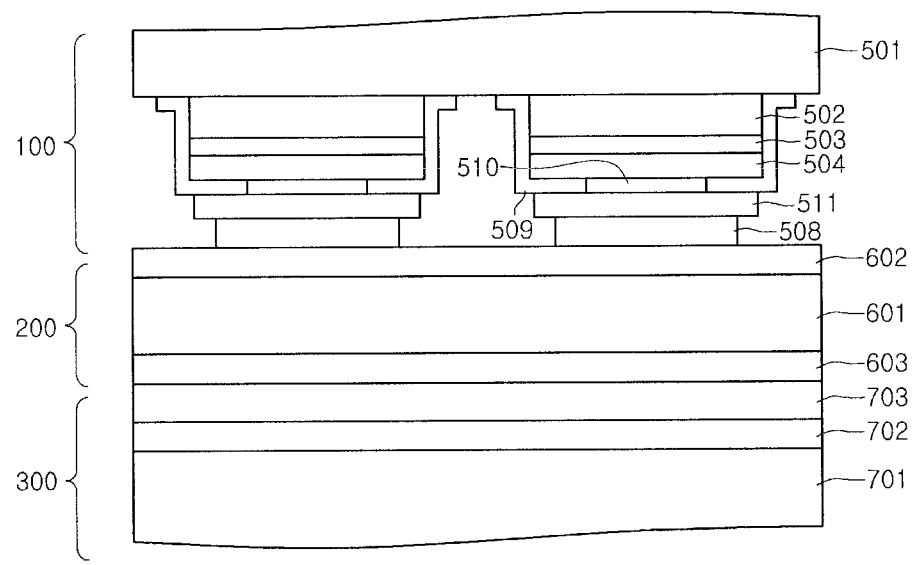

Referring to FIG. 23, a first complex structure is formed by bonding the first structure 100 shown in FIG. 20, the second structure 200 shown in FIG. 21 and the third structure 300 shown in FIG. 22.

The first wafer bonding layer 508 is bonded to the second wafer bonding layer 602, and the third wafer bonding layer 603 is bonded to the fourth wafer bonding layer 703.

Figure 24:
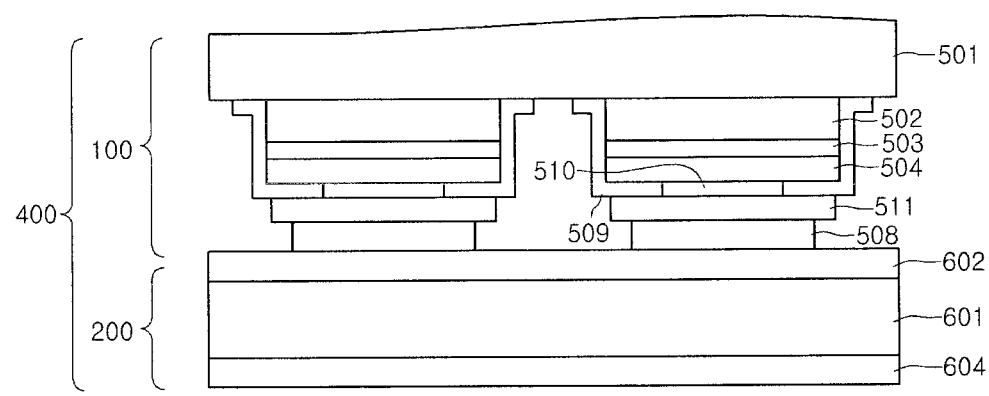

Referring to FIG. 24, the first temporary substrate 701 is removed through the laser lift-off scheme, the drying etching scheme, the wet etching scheme, the CMP scheme, or the polishing scheme.

When the first temporary substrate 701 is removed through the laser lift-off scheme, the first sacrificial separation layer 702 is thermo-chemically decomposed, so that the first temporary substrate 701 can be separated.

Then, the third and fourth wafer bonding layers 603 and 703 are removed and a fifth wafer bonding layer 604 is formed under the first support substrate 601.

In this manner, a second complex structure 400 is formed.

The fifth wafer bonding layer 604 can be formed by using a material having electric conductivity such that the fifth wafer bonding layer 604 may represent strong bonding strength under the predetermined pressure and the temperature of 300° C. to 600° C. For instance, the fifth wafer bonding layer 604 may include at least one selected from the group consisting of Au, Ag, Al, Si, Ge, W, Mo, V, Sc, Hf, Ir, Re, Co, Zr, Ru, Ta, Nb, Mn, Rh, Cu, Ni, Ti, Pd, Pt, Cr, and rare-earth metal.

Figure 25:
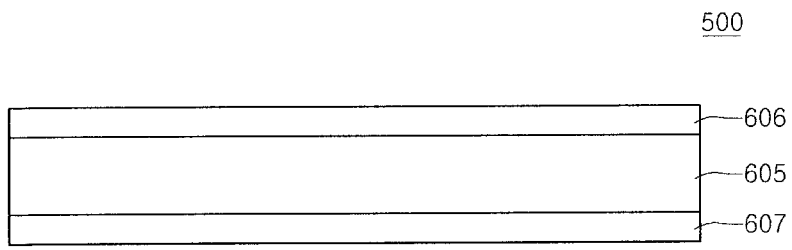

Referring to FIG. 25 a fourth structure 500 is prepared. The fourth structure 500 includes a second support substrate 605 formed at top and bottom surfaces thereof with sixth and seventh wafer bonding layers 606 and 607, respectively.

The second support substrate 605 is an electric conductive layer. The second support substrate 605 may be a wafer substrate including at least one of Si, SiGe, ZnO, GaN, AlSiC and GaAs, or may be a metal, an alloy or a solid solution including at least one of Cu, Ni, Ag, Al, Nb, Ta, Ti, Au, Pd, and W.

The second support substrate 605 can be prepared in the form of a sheet, a disk, or a foil having a thickness of about 10 μm to 1 mm.

The second support substrate 605 can be formed through the electro-plating, physical vapor deposition (PVD), or chemical vapor deposition (CVD).

The second support substrate 605 may be thicker than the first support substrate 601. In detail, the crack or debonding may occur in the light emitting semiconductor layer when the process shown in FIG. 23 is performed due to the difference in thermal expansion coefficient between the light emitting semiconductor layer and the first support substrate 601. In order to reduce the problem derived from the difference in thermal expansion coefficient, the first support substrate 601 is formed with a thin thickness and the second support substrate 605 thicker than the first support substrate 601 is additionally formed in the process shown in FIG. 27, which will be described later.

Similar to the fifth wafer bonding layer 604, the sixth and seventh wafer bonding layers 606 and 607 may include at least one selected from the group consisting of Au, Ag, Al, Si, Ge, W, Mo, V, Sc, Hf, Ir, Re, Co, Zr, Ru, Ta, Nb, Mn, Rh, Cu, Ni, Ti, Pd, Pt, Cr, and rare-earth metal.

Figure 26:
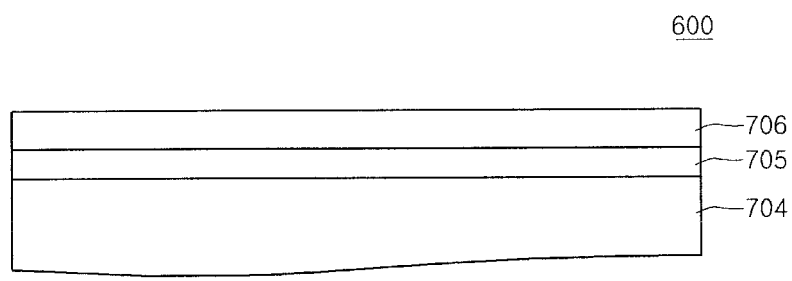

Referring to FIG. 26, a fifth structure 600 is prepared. The fifth structure 600 includes a second sacrificial separation layer 705 and an eighth wafer bonding layer 706 formed on a second temporary substrate 704.

The second temporary substrate 704 may include a material representing difference in thermal expansion coefficient within 2 ppm/° C. with respect to that of the growth substrate 501. The second temporary substrate 704 can be formed by using a material the same as that of the growth substrate 501. For instance, the second temporary substrate 704 may include one of $Al_2O_3$, SiC, Si, and GaAs.

The second sacrificial separation layer 705 may include one of group II-VI compounds including ZnO, which is subject to the thermal-chemical decomposition reaction as laser beam is irradiated thereto; group III-V compounds including GaN; ITO; PZT; and SU-8. In addition, the second sacrificial separation layer 705 may include one of Al, Au, Ag, Cr, Ti, $SiO_2$, and $SiN_x$, which are rapidly dissolved in a wet solution.

Similar to the fifth wafer bonding layer 604, the eighth wafer bonding layer 706 may include at least one selected from the group consisting of Au, Ag, Al, Si, Ge, W, Mo, V, Sc, Hf, Ir, Re, Co, Zr, Ru, Ta, Nb, Mn, Rh, Cu, Ni, Ti, Pd, Pt, Cr, and rare-earth metal.

Figure 27:
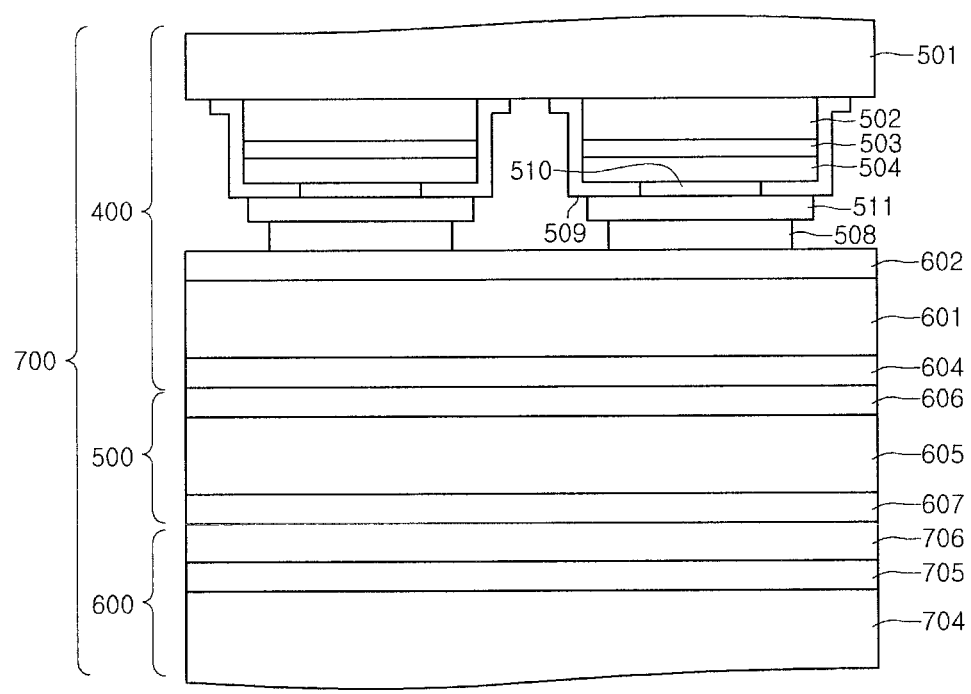

Referring to FIG. 27, a third complex structure 700 is formed by bonding the second complex structure 400 shown in FIG. 24, the fourth structure 500 shown in FIG. 25 and the fifth structure 600 shown in FIG. 26.

The fifth wafer bonding layer 604 is bonded to the sixth wafer bonding layer 606, and the seventh wafer bonding layer 607 is bonded to the eighth wafer bonding layer 706.

Figure 28:
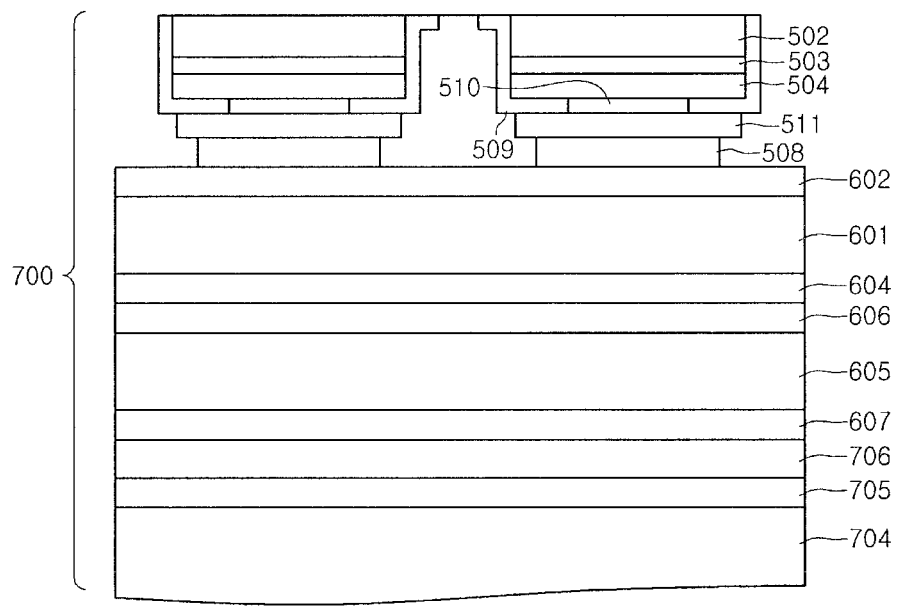

Referring to FIG. 28, the growth substrate 501 is separated from the third complex structure 700 shown in FIG. 27.

Figure 29:
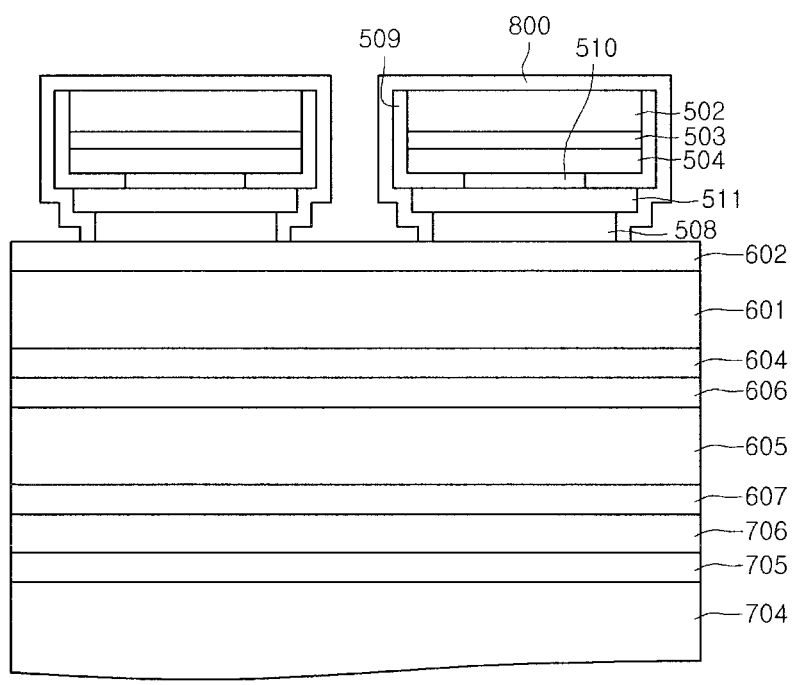

Referring to FIG. 29, a second passivation layer 800 is formed on top surfaces of the first conductive semiconductor layer 502 and the first passivation layer 509, and lateral sides of the first passivation layer 509, the reflective layer 511 and the first wafer bonding layer 508.

Figure 30:
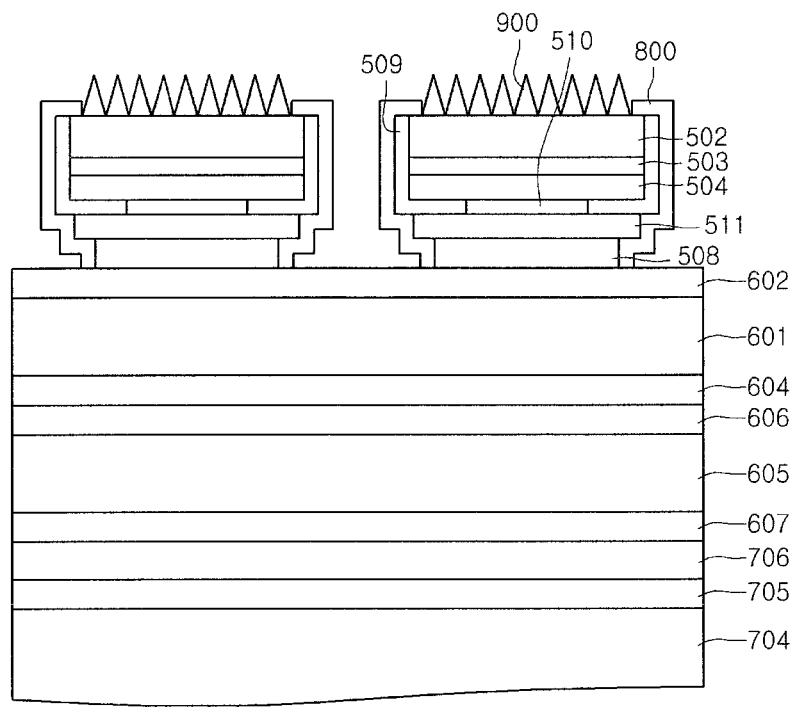

Referring to FIG. 30, the second passivation layer 800 formed on the first conductive semiconductor layer 502 is partially removed to form a light extracting structure 900 on the first conductive semiconductor layer 502.

Figure 31:
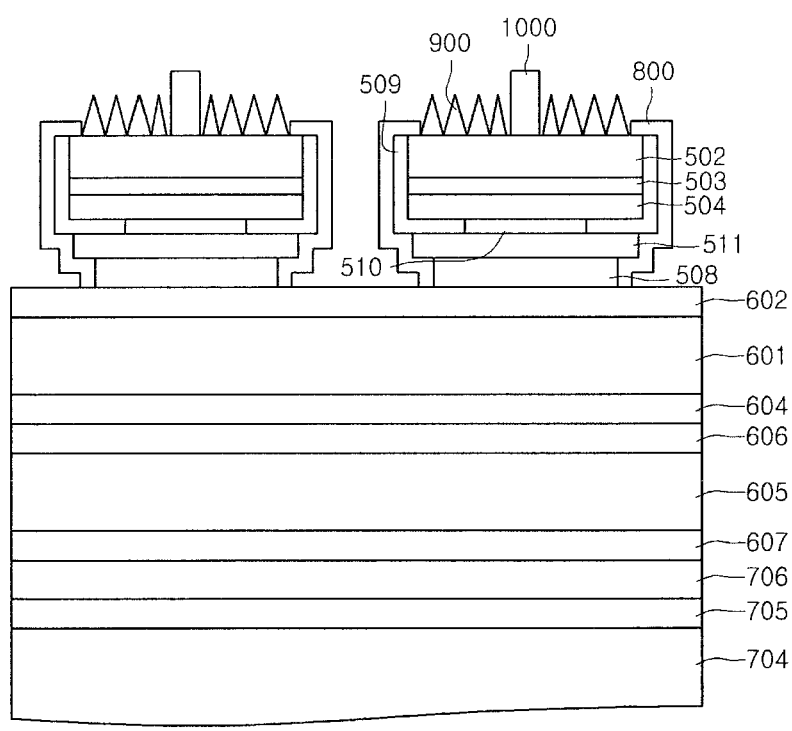

Referring to FIG. 31, a first electrode layer 1000 is formed on the first conductive semiconductor layer 502.

Figure 32:
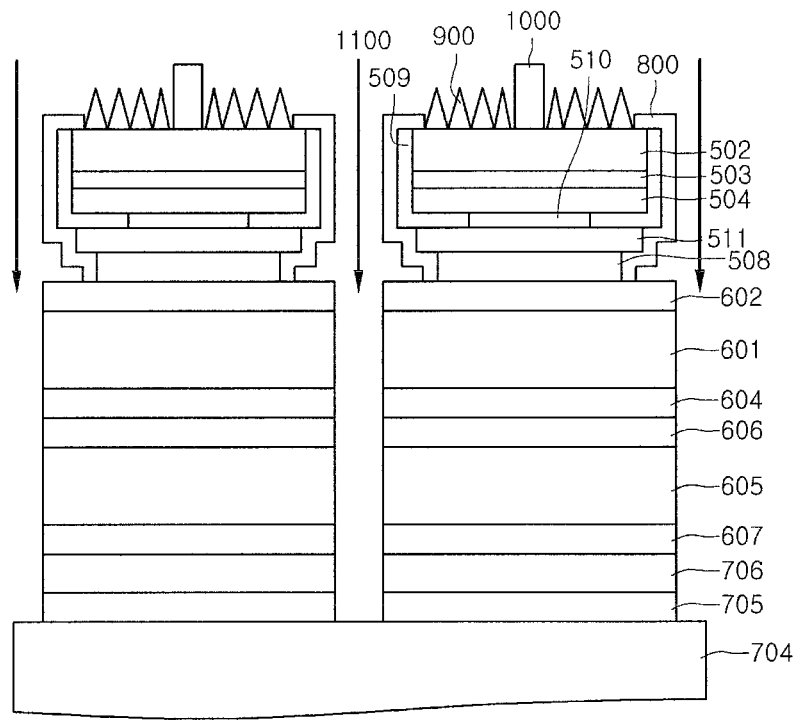

Referring to FIG. 32, an isolation etching 1100 is performed to expose the second temporary substrate 704 such that a plurality of light emitting structures can be formed on the second temporary substrate 704.

Figure 33:
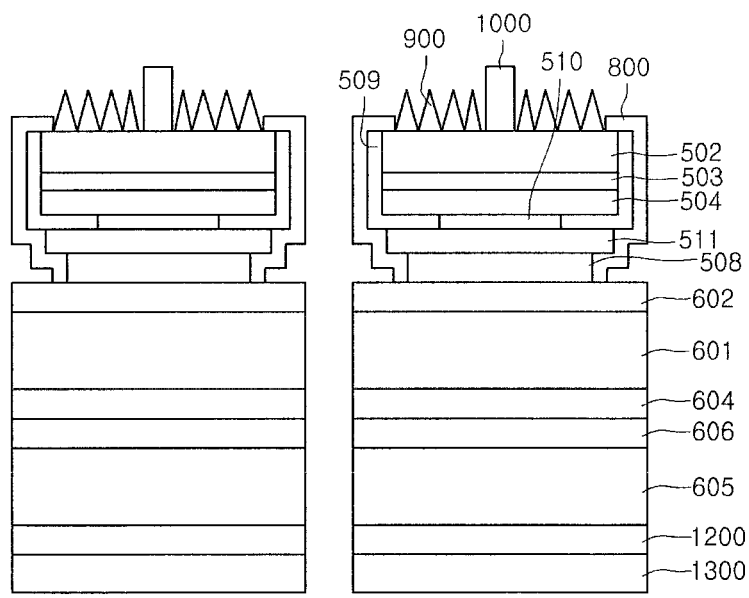

Referring to FIG. 33, the second temporary substrate 704 is removed through the laser lift-off scheme, the drying etching scheme, the wet etching scheme, the CMP scheme, or the polishing scheme.

When the second temporary substrate 704 is removed through the laser lift-off scheme, the second sacrificial separation layer 705 is thermo-chemically decomposed, so that the second temporary substrate 704 can be separated.

Then, the seventh and eighth wafer bonding layers 607 and 706 are removed and an ohmic electrode layer 1200 and a die bonding layer 1300 are formed under the second support substrate 605. The die bonding layer 1300 is securely boned to a circuit board, on which the light emitting device is mounted, or a die at low resistance.

In this manner, the light emitting device according to the third embodiment can be manufactured.

FIGS. 34 to 46 are views showing the procedure for manufacturing a light emitting device according to the fourth embodiment.

The manufacturing method for the light emitting device according to the fourth embodiment is similar to that of the third embodiment, so the description about processes described in the third embodiment will be omitted in order to avoid redundancy.

Figure 34:
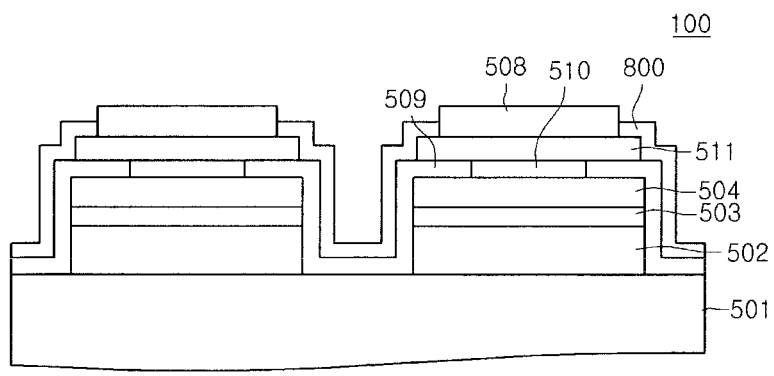
FIGS. 34 to 46 are views showing the procedure for manufacturing a light emitting device according to the fourth embodiment.

Referring to FIG. 34, a light emitting semiconductor layer including a first conductive semiconductor layer 502, an active layer 503 and a second conductive semiconductor layer 504 is formed on a growth substrate 501. In addition, the light emitting semiconductor layer is mesa-etched to form a plurality of unit devices, and a first passivation layer 509 is formed such that the light emitting semiconductor layer is surrounded by the first passivation layer 509. Then, the first passivation layer 509 is removed such that the second conductive semiconductor layer 504 can be partially exposed, and an ohmic contact layer 510 is formed on the second conductive semiconductor layer 504. After that, a reflective layer 511 is formed on the first passivation layer 509 and the ohmic contact layer 510, and a second passivation layer 800 is formed on the reflective layer 511 and the first passivation layer 509. Then, the second passivation layer 800 is partially removed in order to form a first wafer bonding layer 508 on the exposed reflective layer 511, thereby forming a first structure 100.

According to the fourth embodiment, different from the third embodiment, the second passivation layer 800 is formed when the first structure 100 is manufactured.

Figure 35:
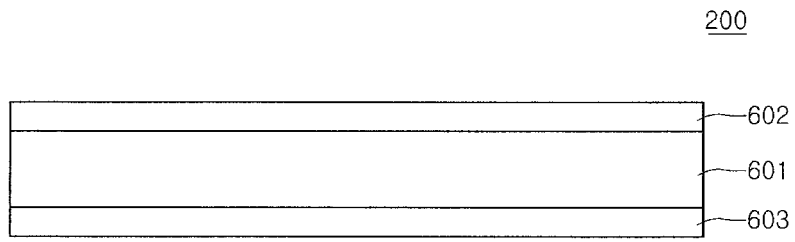

Referring to FIG. 35, a second structure 200 is prepared. The second structure 200 includes a first support substrate 601 formed at top and bottom surfaces thereof with second and third wafer bonding layers 602 and 603, respectively.

Figure 36:
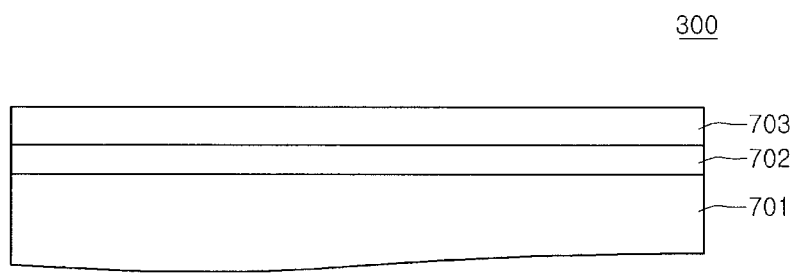

Referring to FIG. 36, a third structure 300 is prepared. The third structure 300 includes a first sacrificial separation layer 702 and a fourth wafer bonding layer 703 formed on a first temporary substrate 701.

Figure 37:
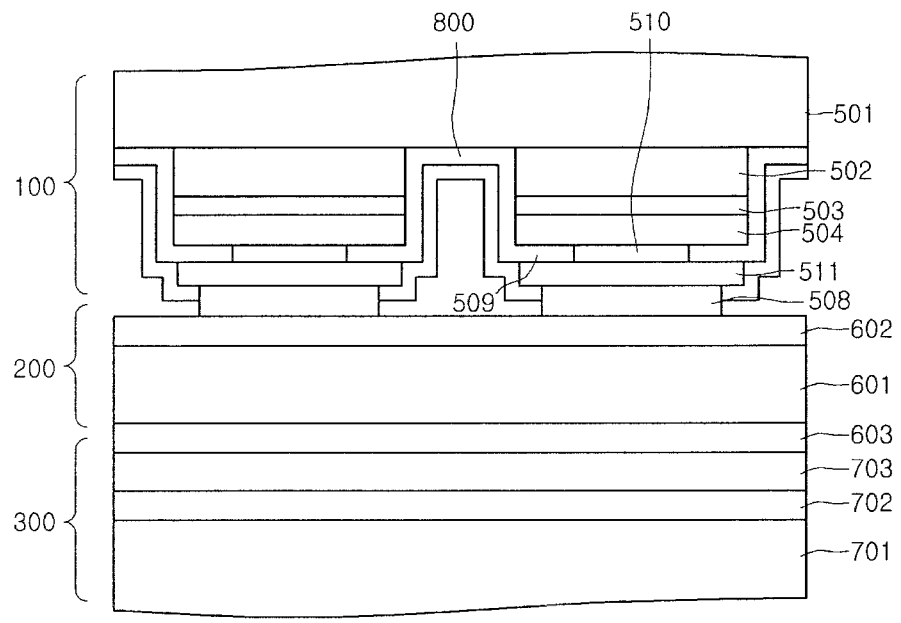

Referring to FIG. 37, a first complex structure is formed by bonding the first structure 100 shown in FIG. 34, the second structure 200 shown in FIG. 35 and the third structure 300 shown in FIG. 36.

The first wafer bonding layer 508 is bonded to the second wafer bonding layer 602, and the third wafer bonding layer 603 is bonded to the fourth wafer bonding layer 703.

Figure 38:
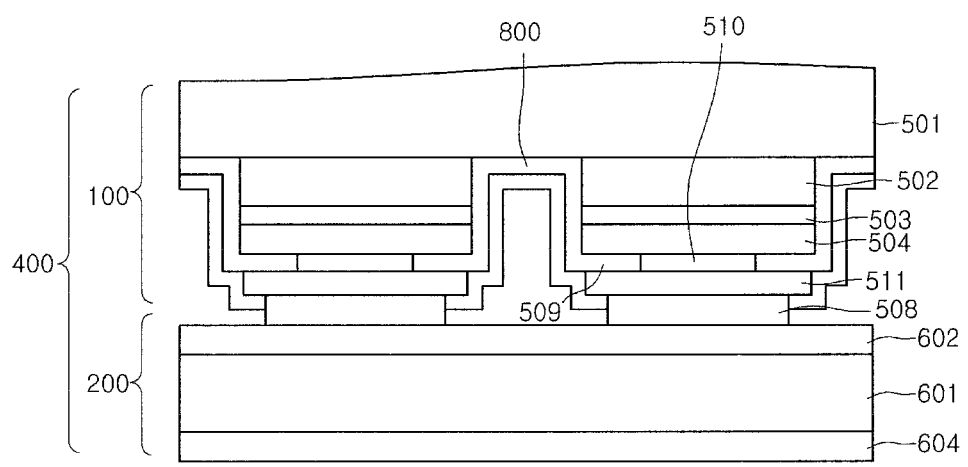

Referring to FIG. 38, the first temporary substrate 701 is removed through the laser lift-off scheme, the drying etching scheme, the wet etching scheme, the CMP scheme, or the polishing scheme.

When the first temporary substrate 701 is removed through the laser lift-off scheme, the first sacrificial separation layer 702 is thermo-chemically decomposed, so that the first temporary substrate 701 can be separated.

Then, the third and fourth wafer bonding layers 603 and 703 are removed and a fifth wafer bonding layer 604 is formed under the first support substrate 601.

In this manner, a second complex structure 400 is formed.

Figure 39:
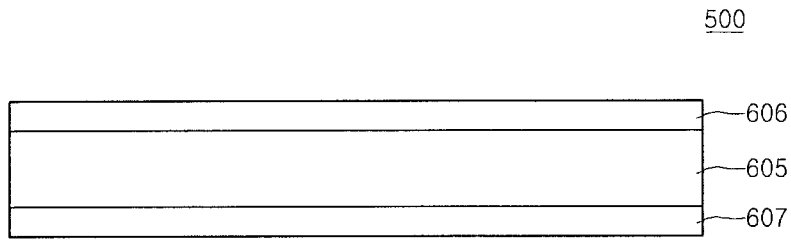

Referring to FIG. 39, a fourth structure 500 is prepared. The fourth structure 500 includes a second support substrate 605 formed at top and bottom surfaces thereof with sixth and seventh wafer bonding layers 606 and 607, respectively.

Figure 40:
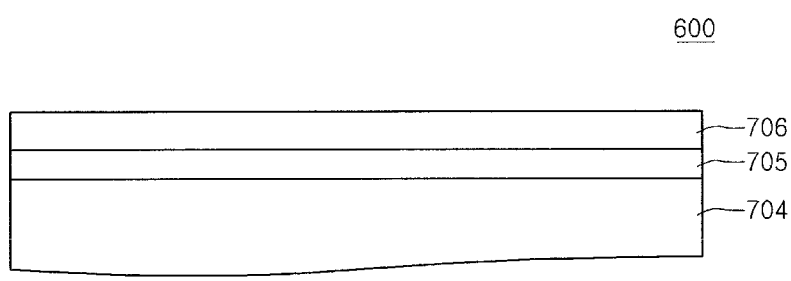

Referring to FIG. 40, a fifth structure 600 is prepared. The fifth structure 600 includes a second sacrificial separation layer 705 and an eighth wafer bonding layer 706 formed on a second temporary substrate 704.

Figure 41:
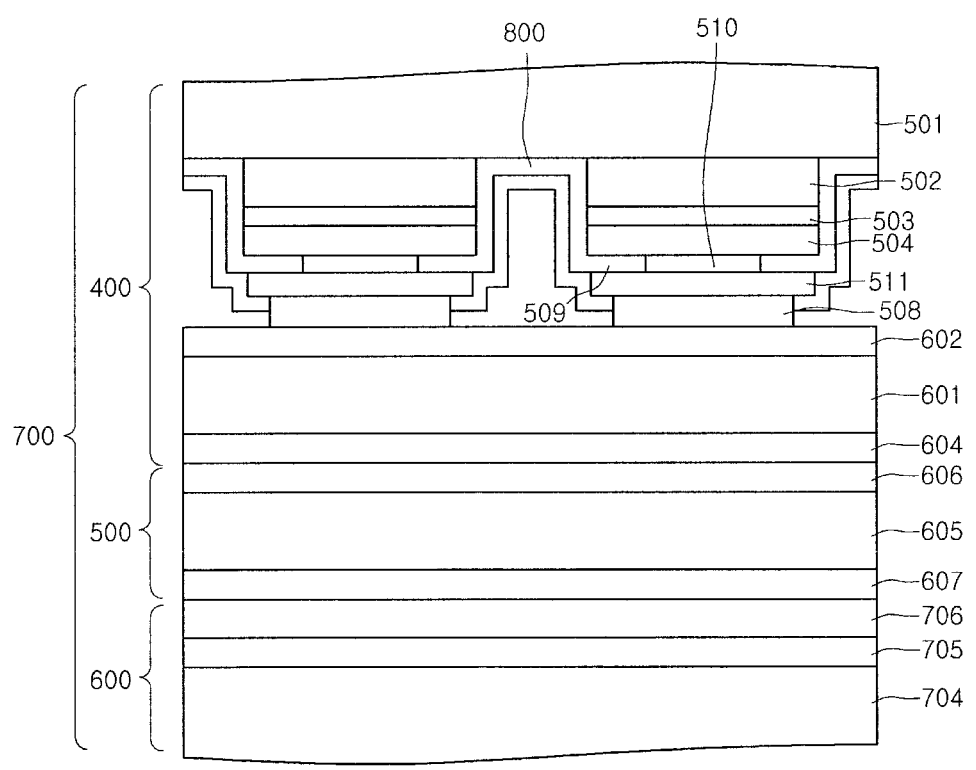

Referring to FIG. 41, a third complex structure 700 is formed by bonding the second complex structure 400 shown in FIG. 38, the fourth structure 500 shown in FIG. 39 and the fifth structure 600 shown in FIG. 40.

The fifth wafer bonding layer 604 is bonded to the sixth wafer bonding layer 606, and the seventh wafer bonding layer 607 is bonded to the eighth wafer bonding layer 706.

Figure 42:
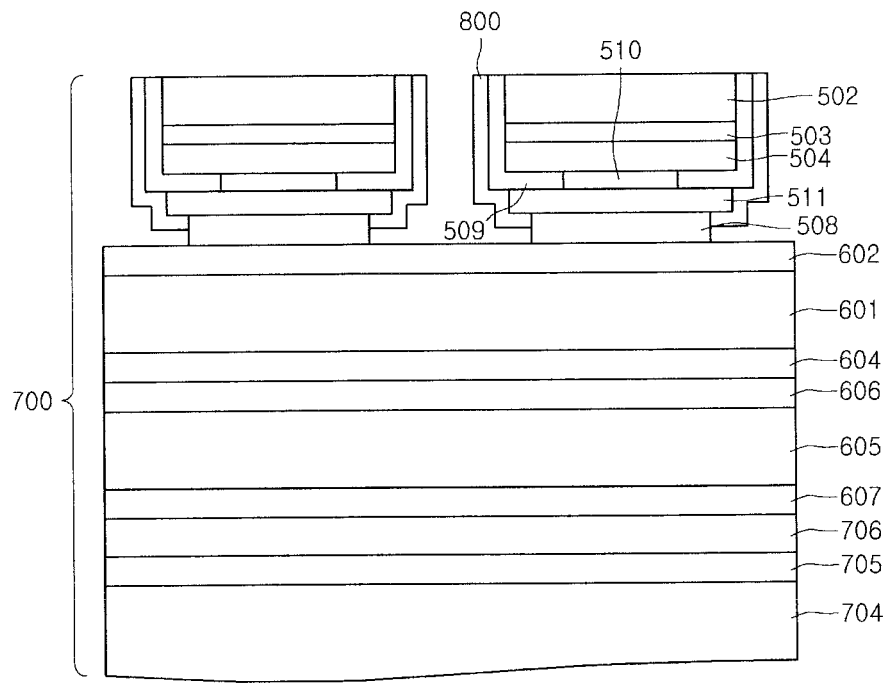

Referring to FIG. 42, the growth substrate 501 is separated from the third complex structure 700 shown in FIG. 41.

Figure 43:
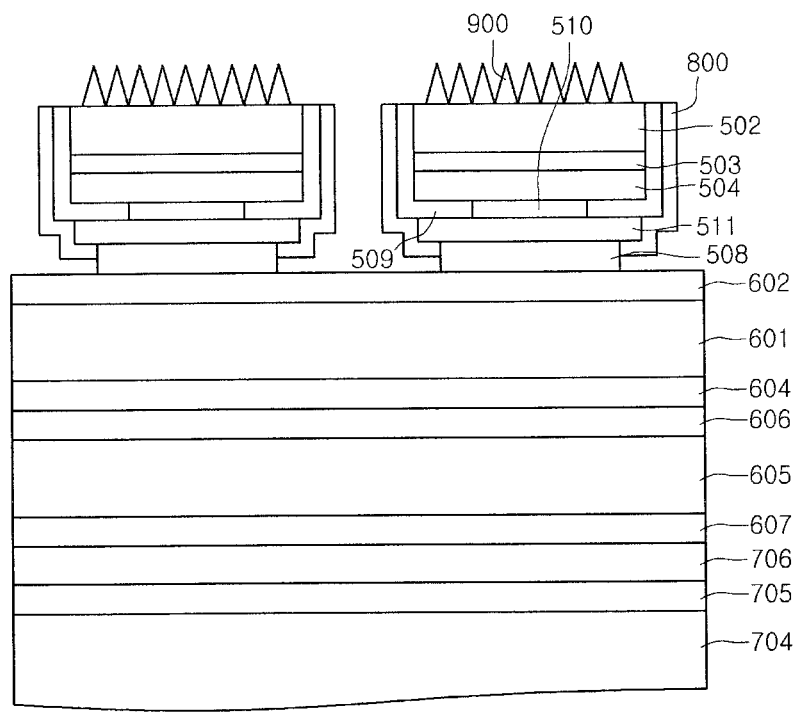

Referring to FIG. 43, a light extracting structure 900 is formed on the first conductive semiconductor layer 502.

Figure 44:
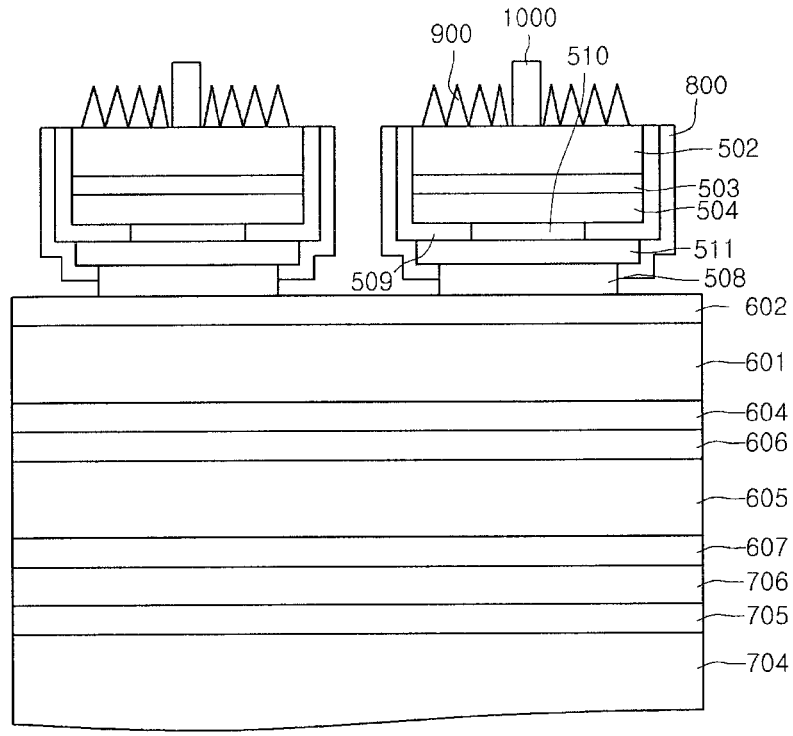

Referring to FIG. 44, a first electrode layer 1000 is formed on the first conductive semiconductor layer 502.

Figure 45:
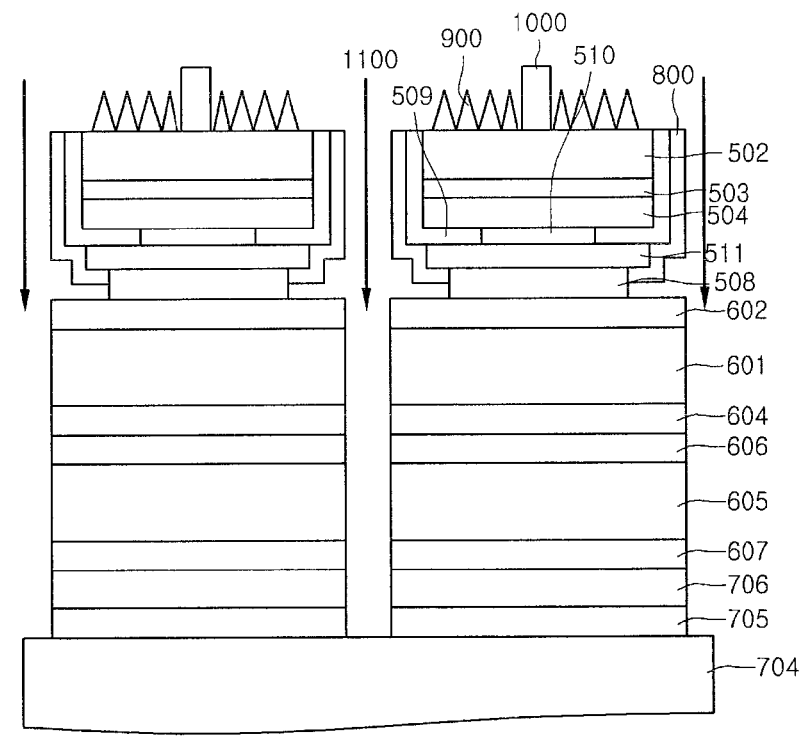

Referring to FIG. 45, an isolation etching 1100 is performed to expose the second temporary substrate 704 such that a plurality of light emitting structures can be formed on the second temporary substrate 704.

Figure 46:
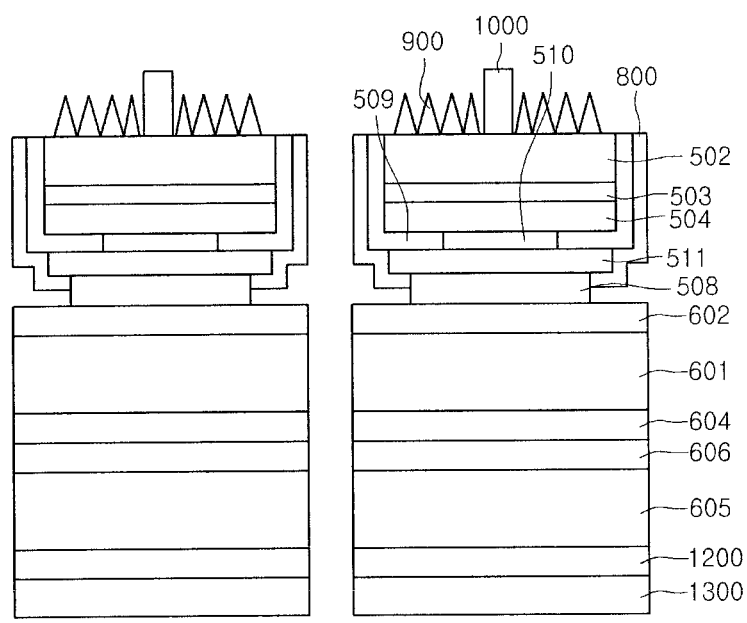

Referring to FIG. 46, the second temporary substrate 704 is removed through the laser lift-off scheme, the drying etching scheme, the wet etching scheme, the CMP scheme, or the polishing scheme.

When the second temporary substrate 704 is removed through the laser lift-off scheme, the second sacrificial separation layer 705 is thermo-chemically decomposed, so that the second temporary substrate 704 can be separated.

Then, the seventh and eighth wafer bonding layers 607 and 706 are removed and an ohmic electrode layer 1200 and a die bonding layer 1300 are formed under the second support substrate 605. The die bonding layer 1300 is securely boned to a circuit board, on which the light emitting device is mounted, or a die at low resistance.

In this manner, the light emitting device according to the fourth embodiment can be manufactured.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

INDUSTRIAL APPLICABILITY

The embodiments are applicable for the method of manufacturing the semiconductor device used as an electronic device or a light source.

The invention claimed is:

1. A light emitting device comprising:
a support substrate;
a reflective layer over the support substrate;
an ohmic contact layer over the reflective layer;
a light emitting semiconductor layer including a second conductive semiconductor layer, an active layer disposed over the second conductive semiconductor layer, and a first conductive semiconductor layer disposed over the active layer;
a first passivation layer surrounding a lateral side of the light emitting semiconductor layer; and
a second passivation layer surrounding lateral sides of the first passivation layer and the reflective layer, wherein a portion of the first passivation layer is disposed between the reflective layer and the light emitting semiconductor layer,
wherein the reflective layer directly contacts the ohmic contact layer and the portion of the first passivation layer.

2. The light emitting device of claim 1, wherein the support substrate includes a first support substrate and a second support substrate disposed under the first support substrate.

3. The light emitting device of claim 2, wherein the second support substrate is thicker than the first support substrate.

4. The light emitting device of claim 2, further comprising a first wafer bonding layer between the reflective layer and the first support substrate and a second wafer bonding layer disposed between the first support substrate and the second support substrate.

5. The light emitting device of claim 1, wherein the second passivation layer is thicker than the first passivation layer.

6. The light emitting device of claim 1, further comprising a wafer bonding layer between the support substrate and the reflective layer.

7. The light emitting device of claim 6, wherein the second passivation layer surrounds at least a part of the wafer bonding layer.

8. The light emitting device of claim 1, wherein the first and second passivation layers include one of $SiO_2$, $Al_2O_3$, and $SiN_x$.

9. The light emitting device of claim 8, wherein the first passivation layer includes a material different from a material of the second passivation layer.

10. The light emitting device of claim 1, further comprising an interface modification layer between the light emitting semiconductor layer and the ohmic contact layer, wherein the interface modification layer includes a superlattice structure, one of InGaN, GaN, AlInN, AlN, InN and AlGaN doped with first conductive impurities, one of InGaN, GaN, AlInN, AlN, InN and AlGaN doped with second conductive impurities, or one of group-III nitride-based elements having nitrogen-polar surfaces.

11. The light emitting device of claim 1, further comprising a light extracting structure over the light emitting semiconductor layer.

12. The light emitting device of claim 1, further comprising a first electrode layer over the light emitting semiconductor layer.

13. The light emitting device of claim 1, further comprising an ohmic electrode layer under the support substrate.

14. The light emitting device of claim 1, wherein a portion of the second passivation layer is disposed under the reflective layer.

15. The light emitting device of claim 1, wherein a portion of the second passivation layer is disposed on a top surface of the light emitting semiconductor layer.

16. The light emitting device of claim 1, further comprising a light extracting structure on the light emitting semiconductor layer.

17. The light emitting device of claim 16, wherein the light emitting semiconductor layer has a substantially flat top surface.

18. The light emitting device of claim 1, wherein a portion of the second conductive semiconductor layer is partially exposed by the first passivation layer.

19. The light emitting device of claim 18, wherein the ohmic contact layer is disposed under the portion of the second conductive semiconductor layer.

* * * * *